(12) United States Patent
Graoui et al.

(10) Patent No.: US 7,482,255 B2
(45) Date of Patent: Jan. 27, 2009

(54) METHOD OF ION IMPLANTATION TO REDUCE TRANSIENT ENHANCED DIFFUSION

(76) Inventors: Houda Graoui, 18035 Stoney Creek Way, Morgan Hill, CA (US) 95037; Majeed Ali Foad, 640 Sheraton Dr., Sunnyvale, CA (US) 94086; Amir Al-Bayati, 820 S. Saratoga Ave., San Jose, CA (US) 95129

( * ) Notice: Subject to any disclaimer, the term of this patent is extended or adjusted under 35 U.S.C. 154(b) by 380 days.

(21) Appl. No.: 11/302,499

(22) Filed: Dec. 14, 2005

(65) Prior Publication Data
US 2006/0160338 A1 Jul. 20, 2006

Related U.S. Application Data

(60) Provisional application No. 60/636,655, filed on Dec. 17, 2004.

(51) Int. Cl.
*H01L 21/425* (2006.01)
(52) U.S. Cl. .................. 438/528; 438/510; 438/525
(58) Field of Classification Search .............. 438/510, 438/524, 528
See application file for complete search history.

(56) References Cited

U.S. PATENT DOCUMENTS

| | | | |
|---|---|---|---|
| 6,074,937 A | 6/2000 | Pramanick et al. | |
| 6,225,176 B1 * | 5/2001 | Yu | ............................ 438/305 |
| 6,372,585 B1 | 4/2002 | Yu | |
| 6,432,798 B1 | 8/2002 | Liu et al. | |
| 6,590,271 B2 | 7/2003 | Liu et al. | |
| 2004/0102013 A1 | 5/2004 | Hwang et al. | |
| 2004/0235280 A1 * | 11/2004 | Keys et al. | .................. 438/528 |
| 2006/0006427 A1 | 1/2006 | Tan et al. | |

FOREIGN PATENT DOCUMENTS

| | | |
|---|---|---|
| EP | 0 717 435 | 6/1996 |
| EP | 1 460 680 | 8/2005 |
| WO | 03/049163 | 6/2003 |

OTHER PUBLICATIONS

P.A. Stolk et al., "Carbon Incorporation in Silicon for Supressing Interstitial-Enhanced Boron Diffusion" in Appl. Phys. Lett. 66(11), Mar. 13, 1995, pp. 1370-1372.

(Continued)

*Primary Examiner*—Bradley K Smith
(74) *Attorney, Agent, or Firm*—Dykema Gossett, PLLC

(57) ABSTRACT

A method of ion implantation comprises the steps of: providing a semiconductor substrate; performing a pre-amorphisation implant in the semiconductor substrate in a direction of implant at an angle in the range of 20-60° to a normal to a surface of the semiconductor substrate, and performing an implant of a dopant in the semiconductor substrate to provide a shallow junction. In a feature of the invention, the method further comprises performing an implant of a defect trapping element in the semiconductor substrate and the pre-amorphisation implant step is performed at a first implant energy and the implant of a defect trapping element is performed at a second implant energy, the ratio of the first implant energy to the second implant energy being in the range of 10-40%.

24 Claims, 7 Drawing Sheets

OTHER PUBLICATIONS

H. Graoui et al., "A Comparative on Ultra-Shallow Junction Formation Using Co-Implantation with Fluorine or Carbon in Pre-Amorphized Silicon" in Materials Science and Engineering B, vol. 124-125, Dec. 5, 2005, pp. 188-191.

V. Moroz et al., "Optimizing boron Junctions Through Point Defect and Stress Engineering Using Carbon and Germanium Co-Implants" in Applied Physics Letters, vol. 87, No. 5, Jul. 26, 2005, pp. 51908-1 to 51908-3.

P.A. Stolk, et al., "Carbon Incorporation in Silicon for Suppressing Interstitial-Enhanced Boron Diffusion" in Applied Physics Letters, Vo. 66, No. 11, Mar. 13, 1995, pp. 1370-1372.

* cited by examiner

METHOD OF ION IMPLANTATION TO REDUCE TRANSIENT ENHANCED DIFFUSION

CROSS-REFERENCE TO RELATED APPLICATION

This application is based on U.S. Provisional Application No. 60/636,655, filed Dec. 17, 2004, the priority of which is claimed.

FIELD OF THE INVENTION The invention relates to a method of ion implantation to reduce transient enhanced diffusion.

BACKGROUND OF THE INVENTION

Transient enhanced diffusion (TED), particularly of shallow doped layers, such as a boron layer, in a silicon substrate of a semiconductor device, is a known problem.

When a shallow doped layer or region, such as a boron layer, is formed in a semiconductor substrate by ion implantation, the junction depth is not just dependent on the ion implant energy but can also depend on channelling and phenomena such as TED when the implanted ions migrate through the crystal lattice during subsequent thermal processing. It is known to use pre-amorphisation techniques to amorphise the semiconductor substrate by, for example, ion implantation using non-electrically active ions, such as silicon, germanium and fluorine, in order to eliminate channelling. However, pre-amorphisation implantation creates in the substrate an amorphous surface layer adjacent the underlying crystalline semiconductor material and produces a large number of defects beyond the amorphous/crystalline (a/c) interface. These crystal defects are usually called End of Range (EOR) defects. Defects of this kind are known to enhance diffusion of previously implanted dopant ions during subsequent thermal processes of annealing and activation of the semiconductor device. It is also known that during the heat treatment (for annealing and activation), the amorphised layer re-crystallises and the EOR defects dissolve semiconductor interstitials that effectively migrate towards the surface of the structure, so that they become present in the surface doped layer to provide a mechanism for TED.

As is known, TED increases the diffusivity of the dopant in the doped layer with the result that the depth of the shallow doped layer is increased. With the desire to reduce the size of semiconductor devices, several techniques have been proposed to reduce the effects of TED so as to reduce the depth of the doped layer by reducing the EOR defects.

WO 03/049163 describes reducing or eliminating TED by providing a layer rich in a trap element located between a surface implanted boron layer, and the EOR defects beyond the amorphous/crystalline (a/c) interface. Then, during heat treatment, migrating defects are essentially halted or trapped by this layer and cannot migrate up to the surface to provide the TED mechanism in the boron layer. As a result, a junction can be formed in the substrate which is shallower and can have a steeper profile.

Although the above PCT publication suggests that the layer of trapping element (typically carbon atoms) can be introduced by the implantation before or after an amorphisation implantation, the embodiment described in the application in detail uses molecular beam epitaxi (MBE) to grow a carbon enriched silicon layer on a silicon substrate, which is then covered with a further layer of pure silicon. The PCT application also suggests that it is important to avoid the presence of carbon atoms in the active boron junction region to avoid impairment of the electrical properties of the junction.

The present invention proposes an implantation procedure which provides an advantage of reducing TED by purely implant techniques.

SUMMARY OF THE INVENTION

In accordance with a first aspect of the present invention there is provided a method of ion implantation comprising the steps of: providing a semiconductor substrate, performing a pre-amorphisation implant in the semiconductor substrate at a first implant energy, performing an implant of a defect trapping element in the semiconductor substrate at a second implant energy, and performing an implant of a dopant in the semiconductor substrate to provide a shallow junction, wherein the ratio of the second implant energy to the first implant energy is in the range of 10-40%.

According to the invention, a substrate is given a pre-amorphisation implant (typically germanium) at a first energy, an implant of a defect trapping element, typically carbon, at a second energy, and an implant of the desired dopant, typically boron, to provide a shallow junction. Clearly, the energy of the pre-amorphisation implant should be sufficient that the amorphous/crystalline interface is well below the shallow boron layer. We have found that best results, in terms of minimising TED, during subsequent heat treatment of the implant, are obtained if the carbon is implanted at about one-quarter of the energy of the germanium amorphising implant. Then, the peak of carbon density with depth is above the amorphous/crystalline (a/c) interface. Further, it is necessary for the carbon peak to be deeper than the boron layer. If the amorphisation implant is at a higher energy, forming a deeper a/c interface, the ratio of carbon implant energy to germanium amorphisation implant energy may be less than one-quarter.

In summary, the ratio of energies between the amorphisation implant and the implant of the trapping element is selected such that the trapping element is positioned between the shallow junction and an interface between amorphous semiconductor material and crystalline semiconductor material (i.e. the a/c interface) of the semiconductor substrate so as to trap the interstitials migrating to the surface of the substrate. Similar ratios of energies between the amorphisation implant and the implant of the trapping element, can be derived for other materials. An alternative for amorphisation is the implantation of silicon ions. Other possible elements as defect trapping elements are nitrogen and fluorine.

In accordance with a second aspect of the invention there is provided a method of ion implantation comprising the steps of: providing a semiconductor substrate, performing a pre-amorphisation implant in the semiconductor substrate in a direction of implant at an angle in the range of 20-60° to a normal to a surface of the semiconductor substrate, and performing an implant of a dopant in the semiconductor substrate to provide a shallow junction.

The method in accordance with the second aspect may further comprise the step of performing an implant of a defect trapping element in the semiconductor substrate.

A feature of the second aspect of the invention is that the angle is in the range of 35-40°.

An implant of a dopant in the semiconductor substrate to provide a shallow junction may comprise performing an implant such that a direction of implant is at an angle in the range of 20-60° to a normal to a surface of the semiconductor substrate.

It will be appreciated that the second aspect described above may be used separately or in conjunction with the first aspect described above.

In accordance with a third aspect of the invention there is provided a method of ion implantation comprising the steps of: providing a silicon substrate; performing a first pre-amorphisation implant in the semiconductor substrate at a first implant energy; performing a second pre-amorphisation implant in the semiconductor substrate at a second implant energy; and performing an implant of a dopant in the semiconductor substrate to provide a shallow junction, wherein the first implant energy is greater than the second implant energy.

Alternatively, a method in accordance with the third aspect comprises the steps of: providing a silicon substrate; performing a first pre-amorphisation implant in the semiconductor substrate at a first implant dose; performing a second pre-amorphisation implant in the semiconductor substrate at a second implant dose; and performing an implant of a dopant in the semiconductor substrate to provide a shallow junction, wherein the first implant dose is greater than the second implant dose.

Furthermore, it will be appreciated that both the implant energy and the implant dose of the first pre-amorphisation implant step may be greater than the implant energy and the implant dose of the second pre-amorphisation implant step.

It will be appreciated that the third aspect described above may be used separately or in conjunction with the first aspect described above and/or the second aspect described above or combination thereof.

BRIEF DESCRIPTION OF THE DRAWINGS

Methods of ion implantation in accordance with the present invention will now be described, by way of example only, with reference to the accompanying drawings in which.

DETAILED DESCRIPTION OF THE DRAWINGS

Experiments demonstrating the advantages of the invention will now be described with reference to the drawings.

As explained, a first aspect of the invention is about the ratio between the trapping element (carbon) and the amorphisation (germanium) implant energy to form the shallowest and the most abrupt junction by co-implanting, for example, Ge, C, and B and using spike annealing. The authors of the PCT application mentioned above describe positioning of the carbon within the amorphous depth without discussing any dependence of boron transient enhanced diffusion (TED) reduction on the positioning of this carbon layer within the amorphous layer.

We propose that the carbon is implanted and the positioning of the carbon is optimized to form the shallowest and the most abrupt junction and efficiently reduce boron TED.

We found that the carbon energy should be the range of 10-40% of the germanium energy, and preferably 25%, otherwise the reduction of boron is not at its optimum. We verified this experimentally with two different amorphous layers (300 A and 1100 A).

Figure 1:
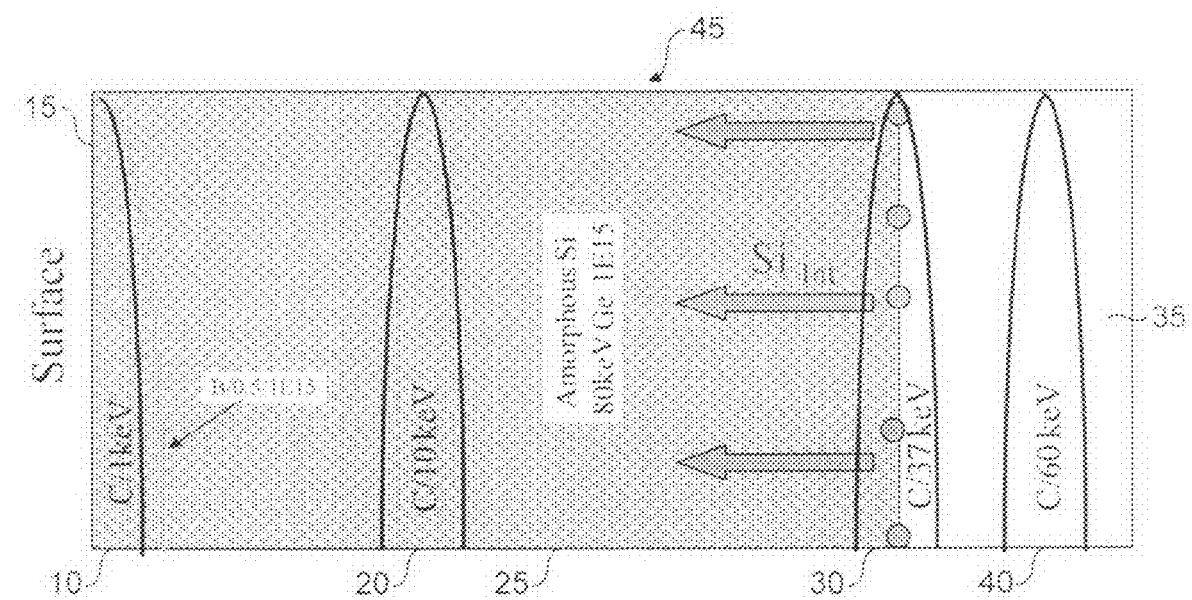
FIG. 1 is a schematic cross-sectional diagram showing different layers of part of a semiconductor substrate and the positions of the carbon trapping element for different implant energies before thermal processing.

FIG. 1 shows part of a semiconductor substrate 45 (in the experiments a silicon substrate was used) prior to annealing having a surface 15 through which implants are made, an amorphous silicon region or layer 25 in the silicon substrate 45 formed by a pre-amorphisation process and a crystalline silicon region 35 in the silicon substrate 45. To obtain the deep amorphous layer of 1100 A we used germanium implanted at 80 keV at 1E15 dose. We implanted the carbon at 1 keV, 10 keV, 37 keV and 60 keV at doses of 2E14, 1E15, 3E15, 4E15 ions/cm2. The resulting positions of the carbon trapping element in the silicon substrate is shown in FIG. 1: position 10 corresponds to carbon implant energy of 1 keV at a dose of 2E14 ions/cm2, position 20 corresponds to carbon implant energy of 10 keV at a dose of 1E15 ions/cm2, position 30 corresponds to carbon implant energy of 37 keV at a does of 3E15 ions/cm2 and position 40 corresponds to carbon implant energy of 60 keV at a dose of 4E15 ions/cm2.

By increasing the dose with increasing carbon energy we maintained a constant peak atomic concentration of carbon of 0.5 at %.

The carbon energies of 1 keV, 10 keV, 37 keV and 60 keV will position the carbon at the 0.5 keV boron Rp, between the boron and the a/c interface, right at the a/c interface beyond which the EOR defect are generated and in crystalline silicon far beyond the a/c interface respectively.

All the samples were implanted with boron at 0.5 keV 1E15 ions/cm2 and annealed at 1050 C spike.

Figure 2:
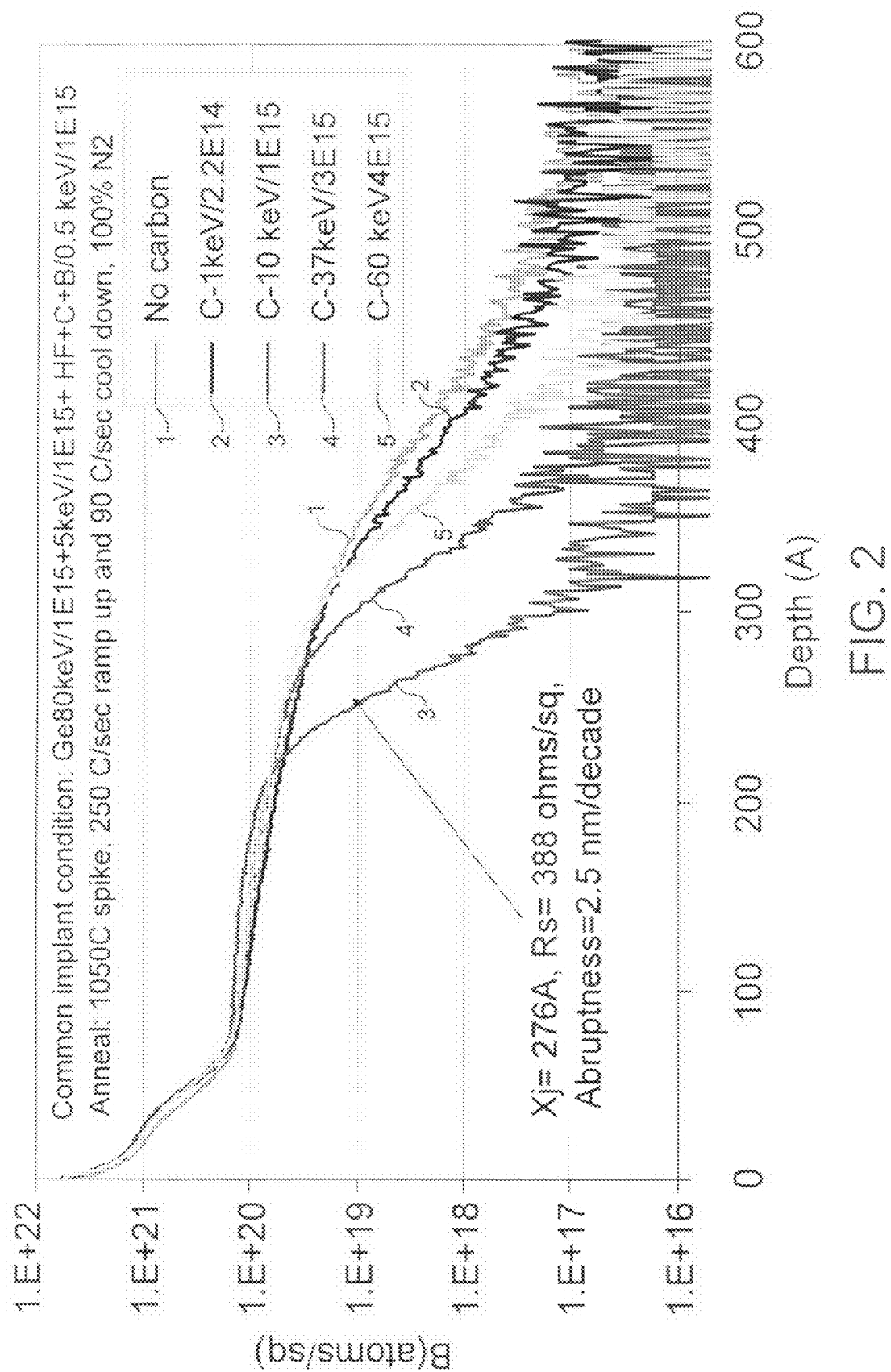
FIG. 2 is a graph showing the boron layer SIMS profiles for different carbon trapping element energies.

The boron SIMS profiles obtained with the four different carbon energies are presented in FIG. 2. It is clear that:

1—The optimum carbon energy needs to be 10 keV to efficiently reduce boron TED.

2—The carbon needs to be positioned within the amorphous layer and not at the a/c interface or beyond that.

3—The carbon should not overlap with the boron.

The question that needed to be answered is: if 10 keV C is the optimum carbon energy for carbon to be positioned within an amorphous layer, is 1100 A the minimum depth of the amorphous layer or is there a minimum depth threshold beyond which the 10 keV carbon energy will not fully reduce boron TED.

To answer this question, we kept the boron and carbon energies unchanged to 0.5 keV and 10 keV respectively and we varied the amorphous depth by implanting germanium at 5 keV, 10 keV and 40 keV and 80 keV.

Figure 3:
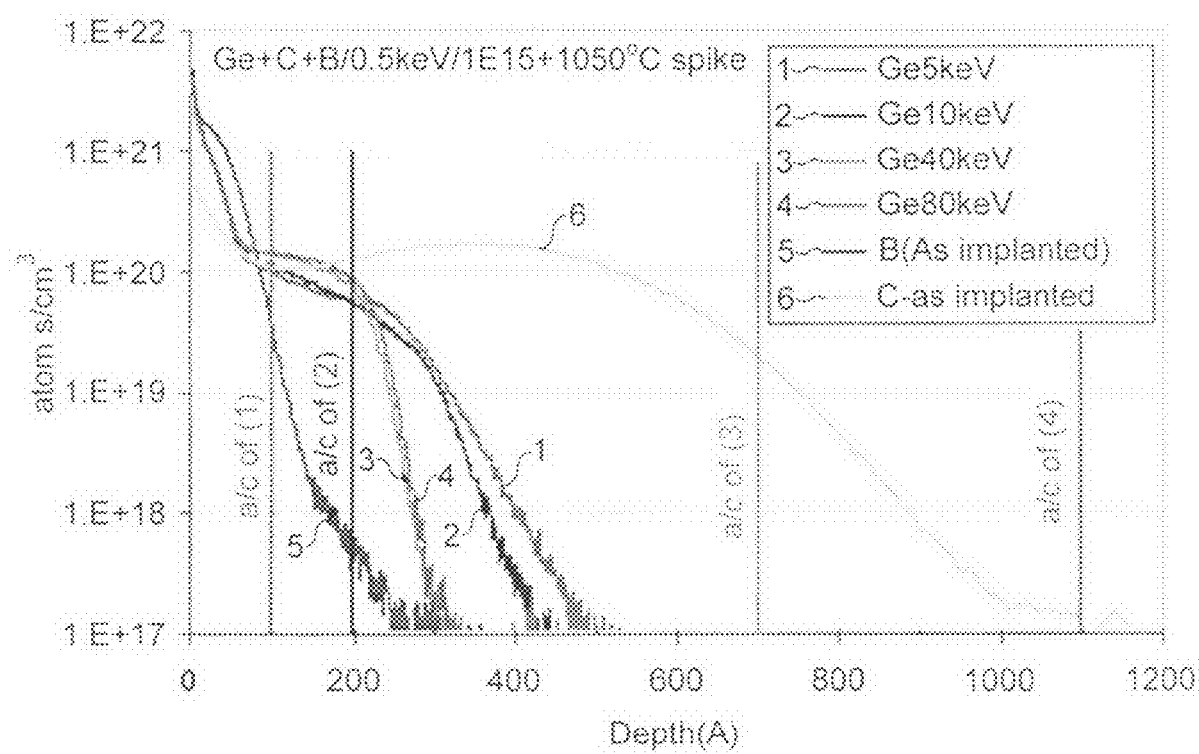
FIG. 3 is a graph showing the boron layer SIMS profiles for different a/c interfaces corresponding to different germanium pre-amorphisation energies.

The boron SIMS profiles of the corresponding junctions are presented in FIG. 3 and the positioning of implanted 10 keV carbon and the different a/c interfaces corresponding to the different Ge energies are also shown.

It is clear that by using 5 and 10 keV germanium the maximum carbon concentration (as implanted peak) will be positioned at 400 A will be beyond the a/c interfaces generated by the two Ge energies which corresponds to 100 and 180 A respectively.

By using germanium energies either at 40 keV, or 80 keV, almost the same junction is obtained thus the minimum germanium energy is 40 keV which corresponds to an amorphous depth of about 580 A.

This minimum germanium energy of 40 keV is four times the carbon energy.

To verify that the energy ratio between the minimum germanium energy and the carbon energy is 4, we implanted a set of wafers with Ge at 20 keV 1E15 dose and boron at 0.5 keV, 1E15 ions/cm2. The carbon is implanted at different energies of 2 keV, 5 keV, 6 keV, 7 keV, 8 keV and 10 keV.

Figure 4:
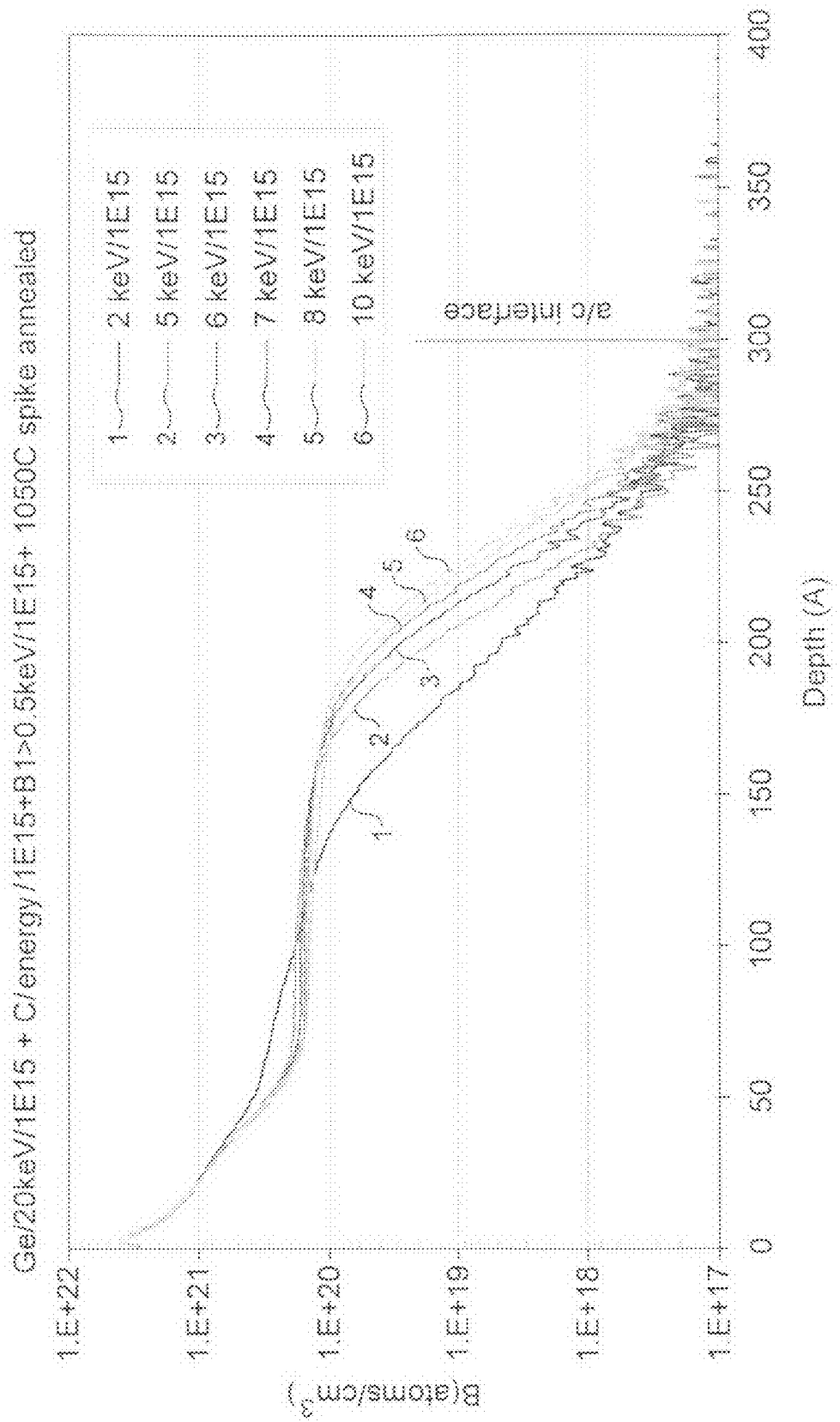
FIG. 4 is a graph showing the boron layer SIMS profiles for different carbon trapping element energies.

It is clear from the boron SIMS profile shown in FIG. 4 that:

1—Carbon co-implantation process is very sensitive to the carbon energy ie: by increasing the carbon energy by only 1 keV the junction changes.

2—When using carbon at 10 keV, the maximum carbon concentration (as implanted peak) is positioned at about 400 A, which placed it beyond the a/c interface created by 20 keV Ge (amorphous depth of 300 A). Which explains the reverse behaviour happening between 8 keV and 10 keV Carbon.

3—The optimum carbon energy is 5 keV which verifies the energy ratio of one to four between the carbon and germanium seen in the previous experiment with 80 keV Ge pre-amorphisation.

It will be appreciated that although the first aspect of the invention has been discussed above with respect to a carbon trapping element, a pre-amorphising germanium implant, a silicon substrate and a boron shallow junction, this is merely for convenience of explanation and not intended to be limiting. Those of skill in the art will understand based on the description given herein that various materials can be used. For example, a pre-amorphisation implant process may comprise implanting any one of the following semiconductor materials into the semiconductor substrate: germanium, silicon, antimony, fluorine or the like. The defect trapping element may be any one of the following materials: carbon, nitrogen and fluorine or the like. The dopant may be any one of the following materials: boron, arsenic and phosphorous or the like. The semiconductor substrate may be a silicon substrate, gallium arsenide substrate or similar substrate.

It will also be appreciated that the implant steps may be carried out in any particular order.

We have also devised a method using tilt for pre-amorphising implants, for example, Ge, Xe, Ar, Sb, In, Si, As, $As_2$. An advantage of using a tilt implant is that the EOR defects are eliminated or at least substantially reduced. This means that the tilt method may be used in combination with a non-equilibrium anneal process, for example, laser annealing.

The tilt method, which will be described in the following, may be used in combination with the method described above or separately.

A tilt method of ion implantation in accordance with the invention comprises the steps of providing a semiconductor substrate, performing a pre-amorphisation implant in the semiconductor substrate in a direction of implant at an angle in the range of 20-60° to a normal to a surface of the semiconductor substrate, and performing an implant of a dopant in the semiconductor substrate to provide a shallow junction.

A step of performing an implant of a defect trapping element in the semiconductor substrate may also be used.

A feature of the tilt method in accordance with the second aspect of the invention may include the step of performing a pre-amorphisation implant further comprising implanting a pre-amorphisation material at an energy which is dependent on the angle of implant.

Figure 5:
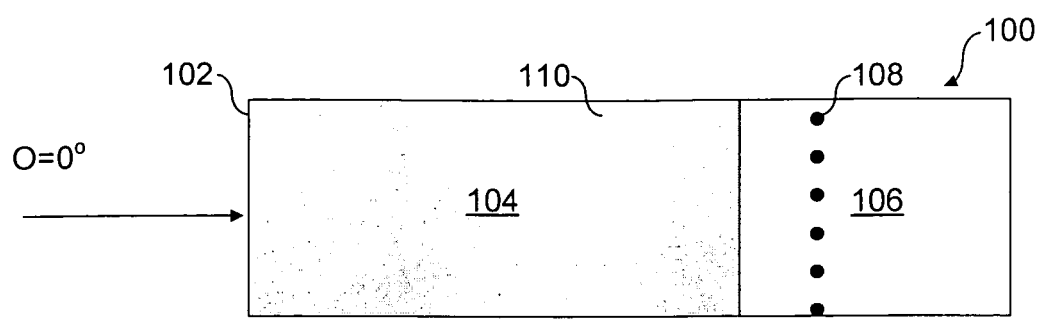
FIG. 5 is a schematic cross-sectional diagram showing different layers of part of a semiconductor substrate after a pre-amorphisation implant at an angle of 0° to the normal to a surface of the semiconductor substrate before thermal processing.
Figure 6:
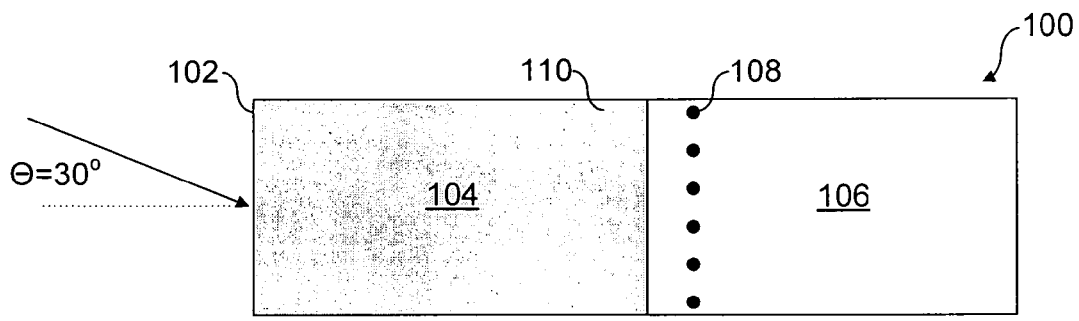
FIG. 6 is a schematic cross-sectional diagram showing different layers of part of a semiconductor substrate after a pre-amorphisation implant at an angle of 30° to the normal to a surface of the semiconductor substrate before thermal processing.
Figure 7:
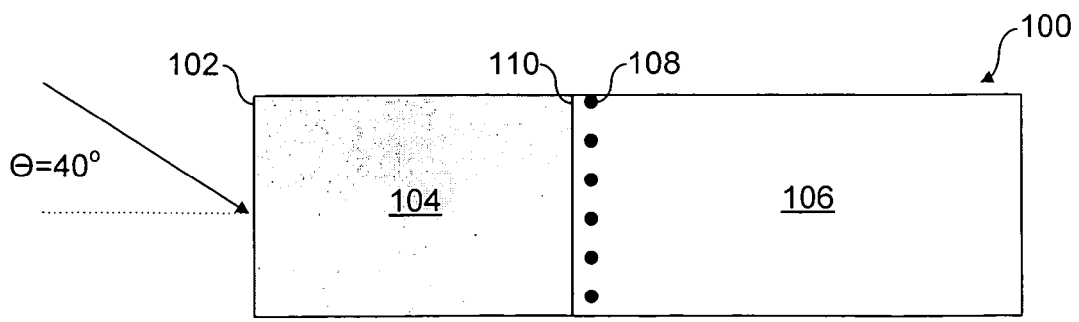
FIG. 7 is a schematic cross-sectional diagram showing different layers of part of a semiconductor substrate after a pre-amorphisation implant at an angle of 40° to the normal to a surface of the semiconductor substrate before thermal processing.

Referring now to FIGS. 5-7 which show part of a semiconductor substrate 100 (in the experiments a silicon substrate was used) prior to annealing having a surface 102 through which implants are made, an amorphous silicon region or layer 104 in the silicon substrate 100 formed by a pre-amorphisation process and a crystalline silicon region 106 in the silicon substrate 100. The a/c interface between the amorphous silicon region 104 and the crystalline silicon region 106 is designated by reference numeral 110. The EOR defects 108 are generated during the implant processes and aggregate in the crystalline silicon region 106 below the a/c interface 110.

FIG. 5 shows the position of the a/c interface 110 and the EOR defects 108 when the pre-amorphisation implant takes place in the direction of the normal to the surface of the substrate 100: that is, at a tilt angle $\theta=0°$.

FIG. 6 shows the position of the a/c interface 110 and the EOR defects 108 when the pre-amorphisation implant takes place in an implant direction at an angle of 30° to the normal to the surface of the substrate 100: that is, at a tilt angle $\theta=30°$.

FIG. 7 shows the position of the a/c interface 110 and the EOR defects 108 when the pre-amorphisation implant takes place in an implant direction at an angle of 40° to the normal to the surface of the substrate 100: that is, at a tilt angle $\theta=40°$.

As can be seen from FIGS. 5-7, the effect of increasing the tilt angle is to reduce the distance between the surface 102 of the substrate and the a/c interface 110. This is due to simple trigonometry. The implant ions penetrate a distance in the direction of implant. When the direction of implant is angled to the surface normal of the silicon substrate (this angle=tilt angle), the depth of penetration is reduced compared to no tilt by $\cos\theta$, where $\theta$ is the tilt angle.

In addition, the distance between the EOR defects 108 and the a/c interface 110 is reduced. The a/c interface depth will be reduced for the same amorphisation implant energy implanted without tilt but the depth below the a/c interface of the EOR is also reduced. Since the EOR defects are closer to the a/c interface, they are statistically more likely to be re-crystallised on substrate re-crystallisation of the amorphous layer during subsequent thermal processing such as an annealing process. Thus, when epitaxially regrown on thermal processing, EOR defects will dissolve/be absorbed into the amorphous layer leaving a good quality crystalline material with the EOR defects eliminated or at least substantially reduced. For example, a 20 keV 1E15 germanium pre-amorphisation implant yields 30 nm depths of the a/c interface from the surface of the substrate and the position of the EOR defects will be at around 50-55 nm from the surface of the substrate.

The tilt angle may be in the range of 20-60° and can still provide the above described advantages. However, a tilt angle of 35-40° is preferred.

Note, the implant energy may be increased (for example, by $\cos\theta$) as the tilt angle ($\theta$) is increased such that the overall thickness of the amorphous silicon region 106 is the same as for a tilt angle $\theta=0°$ (i.e. the a/c interface 110 position is the same). However, in this scenario the phenomena by which the EOR defects are close to the a/c interface 110 (compared to the position of the EOR defects without a tilt implant) still takes place such that the EOR defects are close to the a/c interface 110 and so statistically more likely to be absorbed by the a/c interface. The result being the EOR defects are eliminated or at least substantially reduced.

Figure 8:
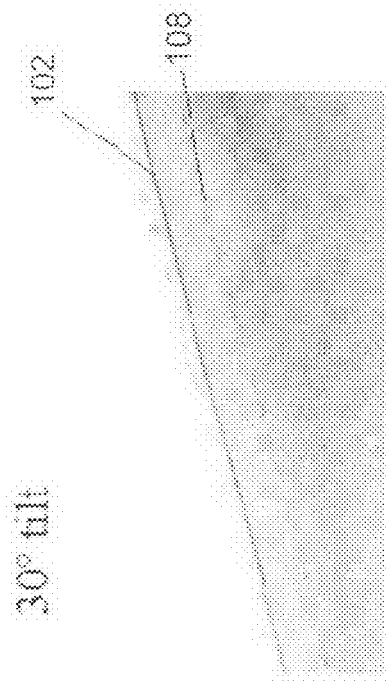
FIG. 8 is a Transmission Electron Microscope (TEM) diagram showing a cross-section of a semiconductor substrate after a pre-amorphisation implant at an angle of 0° to the normal to a surface of the semiconductor substrate and followed by an anneal process.
Figure 9:
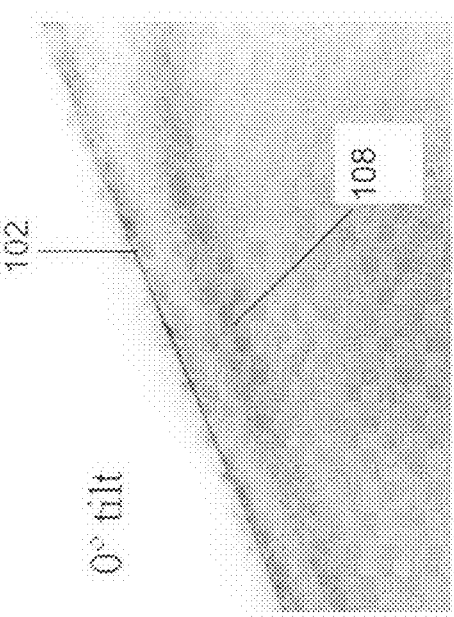
FIG. 9 is a TEM diagram showing a cross-section of a semiconductor substrate after a pre-amorphisation implant at an angle of 30° to the normal to a surface of the semiconductor substrate and followed by an anneal process.
Figure 10:
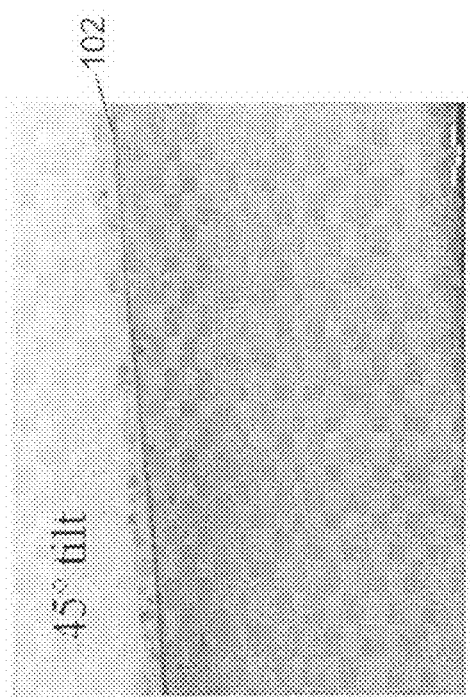
FIG. 10 is a TEM diagram showing a cross-section of a semiconductor substrate after a pre-amorphisation implant at an angle of 40° to the normal to a surface of the semiconductor substrate and followed by an anneal process.

FIGS. 8-10 show TEM diagrams of a cross-section of a semiconductor substrate after implanting germanium at 20, 23, 26 keV, respectively, and a 1E15 dose into silicon substrates followed by a laser anneal at 1325° C. for 0° implant tilt, 30° implant tilt and 40° implant tilt, respectively. The surface of the silicon substrate is designated by reference numeral 102. The EOR defects are designated by reference numeral 108. As can be seen in FIG. 10, with a greater tilt angle, the EOR defects have substantially disappeared.

Tilt implants, where the direction of implant is at an angle to the surface of the substrate, for example Ge/Xe Pre-Amorphisation Implant (PAI) brings the EOR defects close to the edge of heavily damaged or amorphous/crystalline (a/c) interface. This EOR defect will be coupled to amorphous layer. By eliminating or substantially reducing EOR defects, this can reduce junction leakage which is linked to the presence of EOR defects which improves device performance.

Figure 11:
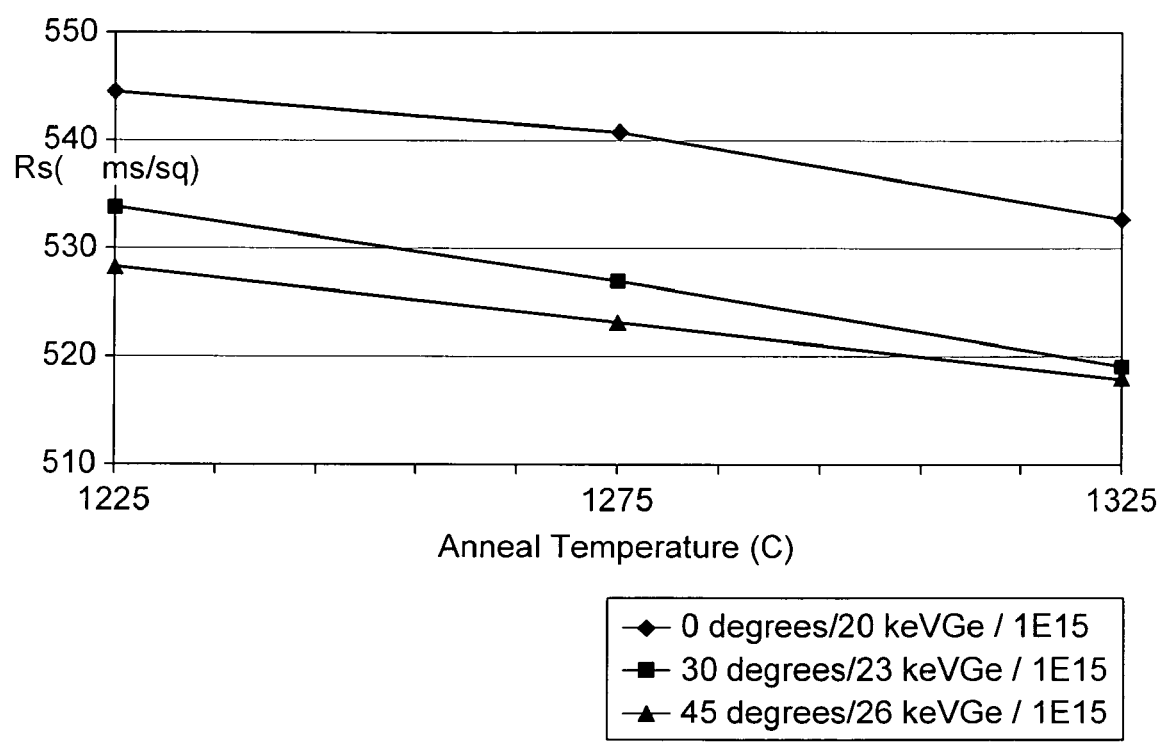
FIG. 11 is a graph showing the sheet resistance for different anneal temperatures for different tilt angles.

A further advantage of using a tilt method for pre-amorphisation implant is that as the number of EOR defects are reduced with increasing tilt angle, the doped region TED is reduced. This results in better activation of the doped region, a reduced sheet resistance (Rs) which results in better device performance. This can be seen in FIG. 11, which shows the different sheet resistances (Rs) for different tilt angles and different temperatures of a laser anneal process.

Defining the implant at a tilt angle can also lead to reducing the lateral straggle of ion (based on trigonometry), this reducing the "width" of the implant profile and increasing the steepness of the trailing edge of the profile. Both effects help in improving the formed junction when a tilt angle is used to implant the junction region.

Anneal processes such as conventional rapid thermal annealing or non-equilibrium/diffusionless annealing, such as laser or flash annealing or others, use high temperatures over a short time and thus typically provide poor activation of the doped region as there is not enough time for the EOR defects to be absorbed on re-crystallisation. Since the method of performing a pre-amorphisation implant at an angle reduces the EOR defects, this approach can be used in combination with such conventional rapid thermal annealing or non-equilibrium/diffusionless annealing such as laser or flash annealing or others. An advantage of these annealing processes is that device activation is improved which enhances device performance.

The approach can also be used as part of a co-implant scheme of more than two implants (for example, a pre-amorphisation tilt implant and a doped region tilt implant and/or a trapping element tilt implant) where one or more of the implants can be performed at a tilt angle.

Reports in the literature suggest that carbon helps eliminate EOR damage by absorbing interstitials. By optimizing the dose and energy of the pre-amorphising implant as well the carbon and boron, it is possible to modulate the solid solubility of boron in silicon. By combining optimal PAI/C/B implants with laser annealing, it is possible to obtain very high activation levels without significant diffusion.

A method in accordance with a third aspect of the invention comprises the steps of:

providing a silicon substrate;

performing a first pre-amorphisation implant in the semiconductor substrate at a first implant energy;

performing a second pre-amorphisation implant in the semiconductor substrate at a second implant energy; and performing an implant of a dopant in the semiconductor substrate to provide a shallow junction, wherein the first implant energy is greater than the second implant energy.

It will be appreciated there may be more than two pre-amorphisation implant steps and the first and second pre-amorphisation steps may take place in any order.

By varying the implant energy of the different pre-amorphisation steps, the EOR defects of the different steps are located in different positions in the crystalline silicon region. A lower energy implant step producing EOR defects closer to the a/c interface than a higher energy implant step (or steps). The lower energy EOR defects couple the higher energy EOR defects to the a/c interface. The result is that a EOR defect path is provided between the remotest EOR defects (i.e. those furthest away from the a/c interface) and the a/c interface which facilitates the absorption of the EOR defects by the a/c interface on thermal processing such as annealing. As discussed above, this results in eliminating or substantially reducing EOR defects. The advantages of eliminating or reducing the EOR defects are described above.

The values of the first and second implant energies are arranged such that the combination is equal substantially to the energy of one typical pre-amorphisation implant step. In other words, a typical pre-amorphisation implant step is split across the first and second implant steps in accordance with the third aspect. For example, for a typical pre-amoprhisation step having energy E1 and dose D, the first pre-amorphisation implant step is at first energy E1 and the dose is in the range of 0.5D-1D and the second implant step is at a second energy E2, where E2 is in the range 0.7E1 to 0.95E1, and the dose is in the range of 0.3D-0.5D. Thus, the total of the first and second doses could be 100-150% of D.

As an example, the first pre-amorphisation implant step comprises an implant of germanium at 18 keV 7E14 dose and the second pre-amorphisation implant step comprises an implant of germanium at 16 keV 5E14 dose.

This third aspect of the invention may be used separately or together with the method in accordance with the first aspect described above and/or the method in accordance with the second aspect described above or any combinations thereof.

It will be appreciated that instead of having different pre-amorphisation implant steps having different implant energies, the third aspect of the invention may have different pre-amorphisation implant steps having different implant doses. The affect on the position of the EOR defects is the same as with different implant energies: a EOR defect path is formed between the remotest EOR defects and the a/c interface.

The values of the first and second implant doses are arranged such that the combination is equal substantially to the dose of one typical pre-amorphisation implant step. In other words, a typical pre-amorphisation implant step is split across the first and second implant steps in accordance with the third aspect. For example, for a typical pre-amorphisation step having dose D, the first implant dose is in the range 50-100% of D and the second implant step is 30-50% of D. Thus, the total of the first and second doses could be 100-150% of D.

The invention claimed is:

1. A method of ion implantation comprising the steps of:
   providing a silicon substrate;
   performing a first pre-amorphisation implant in the semiconductor substrate at a first implant energy;
   performing a second pre-amorphisation implant in the semiconductor substrate at a second implant energy; and
   after performing the first and second pre-amorphisation implants, performing an implant of a dopant in the semiconductor substrate to provide a shallow junction, wherein the first implant is greater than the second implant energy.

2. The method of ion implantation according to claim 1, further comprising the step of:
   performing an implant of a defect trapping element in the semiconductor substrate at a third implant energy; and
   wherein the ratio of the third implant energy to the first implant energy is in the range of 10-40%.

3. The method of claim 2, wherein the ratio is substantially 25%.

4. The method of claim 2, wherein performing a pre-amorphisation implant step comprises implanting any one of the following semiconductor materials into the semiconductor substrate: germanium, silicon, fluorine, antimony.

5. The method of claim 2, wherein the defect trapping element is any one of the following materials: carbon, nitrogen and fluorine.

6. The method of claim 2, wherein performing a pre-amorphisation implant step comprises implanting germanium into the semiconductor substrate, wherein the defect trapping element is carbon and wherein the ratio of the third implant energy to the first implant energy is substantially 25%.

7. The method of claim 2, wherein the dopant is selected from the grouping consisting of boron, arsenic and phosphorous.

8. The method of claim 2, wherein performing a pre-amorphisation implant step comprises performing an implant such that a direction of implant is at an angle in the range of 20-60° to normal to a surface of the semiconductor substrate.

9. The method of claim 8, wherein the angle is in the range 35-40°.

10. The method of claim 8, wherein the step of performing a pre-amorphisation implant further comprises implanting a pre-amorphisation material at an implant energy which is dependent on the angle of implant, the implant energy being increased as the angle is increased.

11. The method of claim 10, further comprising the step of performing an anneal process.

12. The method of claim 11, wherein the anneal process comprises one of a rapid thermal anneal and a non-equilibrium anneal.

13. The method of claim 1, wherein performing a pre-amorphisation implant step comprises performing an implant such that a direction of implant is at an angle in the range of 20-60° to normal to a surface of the semiconductor substrate.

14. The method of claim 13, wherein the step of performing an implant of a dopant comprises performing an implant such that a direction of implant is at an angle in the range of 20-60° to a normal to a surface of the semiconductor substrate.

15. The method of claim 13, wherein the angle is in the range 35-40°.

16. The method of claim 13, wherein the step of performing a pre-amorphisation implant further comprises implanting a pre-amorphisation material at an implant energy which is dependent on the angle of implant, the implant energy being increased as the angle is increased.

17. The method of claim 13, further comprising performing an implant of a defect trapping element in the semiconductor substrate.

18. The method of claim 13, further comprising the step of performing an anneal process.

19. The method of claim 18, wherein the anneal process comprises one of a rapid thermal anneal and a non-equilibrium anneal.

20. A method of ion implantation comprising the steps of:
    providing a silicon substrate;
    performing a first pre-amorphisation implant in the semiconductor substrate at a first implant dose;
    performing a second pre-amorphisation implant in the semiconductor substrate at a second implant dose; and
    after performing the first and second pre-amorphisation implants, performing an implant of a dopant in the semiconductor substrate to provide a shallow junction, wherein the first implant dose is greater than the second implant dose.

21. The method of ion implantation according to claim 20 wherein the first pre-amorphisation implant is performed at a first implant energy and the second pre-amorphisation implant is performed at a second implant energy and the method further comprises the step of:
    performing an implant of a defect trapping element in the semiconductor substrate at a third implant energy; and
    wherein the ratio of the third implant energy to the first implant energy is in the range of 10-40%.

22. The method of claim 21, wherein performing a pre-amorphisation implant step comprises implanting germanium into the semiconductor substrate, wherein the defect trapping element is carbon and wherein the ratio of the third implant energy to the first implant energy is substantially 25%.

23. The method of claim 20, wherein performing a pre-amorphisation implant step comprises performing an implant such that a direction of implant is at an angle in the range of 20-60 to normal to a surface of the semiconductor substrate.

24. The method of claim 23, wherein the step of performing a pre-amorphisation implant further comprises implanting a pre-amorphisation material at an implant energy which is dependent on the angle of implant, the implant energy being increased as the angle is increased.

* * * * *